(12) United States Patent
Botula et al.

(10) Patent No.: US 11,152,495 B2
(45) Date of Patent: *Oct. 19, 2021

(54) INTEGRATED CIRCUIT HEAT DISSIPATION USING NANOSTRUCTURES

(71) Applicant: INTERNATIONAL BUSINESS MACHINES CORPORATION, Armonk, NY (US)

(72) Inventors: Alan B. Botula, Essex Junction, VT (US); Max L. Lifson, South Burlington, VT (US); James A. Slinkman, Montpelier, VT (US); Theodore G. Van Kessel, Millbrook, NY (US); Randy L. Wolf, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,290

(22) Filed: Sep. 30, 2019

(65) Prior Publication Data

US 2020/0027973 A1    Jan. 23, 2020

Related U.S. Application Data

(63) Continuation of application No. 16/031,210, filed on Jul. 10, 2018, now Pat. No. 10,629,710, which is a
(Continued)

(51) Int. Cl.
*H01L 29/732*    (2006.01)
*H01L 23/373*    (2006.01)
(Continued)

(52) U.S. Cl.
CPC ............ *H01L 29/732* (2013.01); *B82Y 10/00* (2013.01); *H01L 21/02112* (2013.01);
(Continued)

(58) Field of Classification Search
CPC ............ H01L 29/732; H01L 21/02271; H01L 21/2885; H01L 21/32051; H01L 21/32053;
(Continued)

(56) References Cited

U.S. PATENT DOCUMENTS 7,499,776 B2    3/2009   Allard et al.
8,039,726 B2    10/2011  Zhang et al.
(Continued)

OTHER PUBLICATIONS

Lifson et al., "Diameter and Location Control of ZnO Nanowires Using Electrodeposition and Sodium Citrate", Applied Physics A, Jan. 17, 2013; 5 Pages.
(Continued)

*Primary Examiner* — Patricia D Reddington
(74) *Attorney, Agent, or Firm* — Steven Meyers; Andrew M. Calderon; Roberts Calderon Safran & Cole, P.C.

(57) ABSTRACT

An approach for heat dissipation in integrated circuit devices is provided. A method includes forming an isolation layer on an electrically conductive feature of an integrated circuit device. The method also includes forming an electrically conductive layer on the isolation layer. The method additionally includes forming a plurality of nanowire structures on a surface of the electrically conductive layer.

20 Claims, 7 Drawing Sheets

Related U.S. Application Data continuation of application No. 15/471,090, filed on Mar. 28, 2017, now Pat. No. 10,109,553, which is a continuation of application No. 15/074,165, filed on Mar. 18, 2016, now Pat. No. 9,666,701, which is a continuation of application No. 14/189,284, filed on Feb. 25, 2014, now Pat. No. 9,324,628.

(51) Int. Cl.

| | | |
|---|---|---|
| *H01L 29/78* | (2006.01) | |
| *H01L 29/45* | (2006.01) | |
| *H01L 23/525* | (2006.01) | |
| *H01L 21/02* | (2006.01) | |
| *H01L 21/285* | (2006.01) | |
| *H01L 29/10* | (2006.01) | |
| *H01L 29/08* | (2006.01) | |
| *H01L 49/02* | (2006.01) | |
| *H01L 29/06* | (2006.01) | |
| *H01L 21/762* | (2006.01) | |
| *B82Y 10/00* | (2011.01) | |
| *H01L 29/417* | (2006.01) | |
| *H01L 29/41* | (2006.01) | |
| *H01L 23/367* | (2006.01) | |
| *H01L 21/48* | (2006.01) | |
| *H01L 21/288* | (2006.01) | |
| *H01L 21/3205* | (2006.01) | |
| *H01L 23/48* | (2006.01) | |
| *H01L 23/485* | (2006.01) | |
| *H01L 29/66* | (2006.01) | |

(52) U.S. Cl.
CPC .......... *H01L 21/02178* (2013.01); *H01L 21/02189* (2013.01); *H01L 21/02271* (2013.01); *H01L 21/02488* (2013.01); *H01L 21/02554* (2013.01); *H01L 21/02603* (2013.01); *H01L 21/02628* (2013.01); *H01L 21/2855* (2013.01); *H01L 21/2885* (2013.01); *H01L 21/28518* (2013.01); *H01L 21/28568* (2013.01); *H01L 21/32051* (2013.01); *H01L 21/32053* (2013.01); *H01L 21/4882* (2013.01); *H01L 21/7624* (2013.01); *H01L 23/3677* (2013.01); *H01L 23/3731* (2013.01); *H01L 23/3738* (2013.01); *H01L 23/5256* (2013.01); *H01L 28/20* (2013.01); *H01L 29/0649* (2013.01); *H01L 29/0676* (2013.01); *H01L 29/0804* (2013.01); *H01L 29/0821* (2013.01); *H01L 29/1004* (2013.01); *H01L 29/413* (2013.01); *H01L 29/41725* (2013.01); *H01L 29/45* (2013.01); *H01L 29/456* (2013.01); *H01L 29/78* (2013.01); *H01L 21/02521* (2013.01); *H01L 23/481* (2013.01); *H01L 23/485* (2013.01); *H01L 29/0665* (2013.01); *H01L 29/0673* (2013.01); *H01L 29/66242* (2013.01); *H01L 2924/0002* (2013.01)

(58) Field of Classification Search
CPC .......... H01L 29/1004; H01L 29/0821; H01L 29/0804; H01L 28/20; H01L 29/0649; H01L 21/7624; H01L 21/4882; H01L 23/3738; H01L 21/02488; H01L 21/02554; H01L 21/02603; H01L 21/02628; H01L 29/456; H01L 29/41725; H01L 29/0676; H01L 29/413; H01L 23/3677; H01L 23/3731; H01L 29/78; H01L 29/45; H01L 23/5256; H01L 21/02178; H01L 21/02189; H01L 21/02112; H01L 21/28518; H01L 21/2855; H01L 21/28568; H01L 23/481; H01L 23/485; H01L 2924/0002; H01L 29/0673; H01L 29/66242; B82Y 10/00
See application file for complete search history.

(56) References Cited

U.S. PATENT DOCUMENTS

| | | |
|---|---|---|
| 8,058,802 B2 | 11/2011 | Li et al. |
| 8,298,875 B1 | 10/2012 | Or-Bach et al. |
| 8,367,462 B2 | 2/2013 | Wang et al. |
| 8,415,787 B2 | 4/2013 | Kabir |
| 8,916,966 B2 | 12/2014 | Mays |
| 9,166,135 B2 | 10/2015 | Ramer et al. |
| 9,324,628 B2 | 4/2016 | Botula et al. |
| 9,601,606 B2 | 3/2017 | Botula et al. |
| 9,666,701 B2 * | 5/2017 | Botula .............. H01L 21/02628 |
| 9,704,978 B2 | 7/2017 | Botula et al. |
| 10,068,827 B2 | 9/2018 | Botula et al. |
| 10,109,553 B2 | 10/2018 | Botula et al. |
| 10,600,893 B2 | 3/2020 | Botula et al. |
| 10,629,710 B2 * | 4/2020 | Botula ................ H01L 23/3731 |
| 2004/0152240 A1 | 8/2004 | Dangelo |
| 2005/0046017 A1 | 3/2005 | Dangelo |
| 2005/0257821 A1 | 11/2005 | Ramanathan et al. |
| 2006/0197436 A1 | 9/2006 | Conley et al. |
| 2006/0228835 A1 | 10/2006 | Furukawa et al. |
| 2006/0266402 A1 | 11/2006 | Zhang et al. |
| 2007/0045762 A1 | 3/2007 | Nogami et al. |
| 2007/0108435 A1 * | 5/2007 | Harmon .............. H01L 29/0676 257/9 |
| 2007/0126037 A1 | 6/2007 | Ikeda |
| 2008/0043437 A1 | 2/2008 | Refai-Ahmed |
| 2008/0090401 A1 | 4/2008 | Bratkovski et al. |
| 2008/0102584 A1 | 5/2008 | Kerr et al. |
| 2008/0179586 A1 | 7/2008 | Kamins |
| 2009/0121343 A1 | 5/2009 | Basker et al. |
| 2009/0233124 A1 | 9/2009 | Berg et al. |
| 2010/0032804 A1 * | 2/2010 | Balster ................ H01L 29/7378 257/586 |
| 2011/0186990 A1 | 8/2011 | Mawatari et al. |
| 2012/0090816 A1 | 4/2012 | Bayazitoglu et al. |
| 2012/0146098 A1 | 6/2012 | Dahlstrom et al. |
| 2012/0164767 A1 | 6/2012 | Gasse et al. |
| 2012/0181663 A1 | 7/2012 | Lukaitis et al. |
| 2012/0299175 A1 | 11/2012 | Tran |
| 2012/0314726 A1 | 12/2012 | Lee et al. |
| 2013/0313677 A1 * | 11/2013 | Qian ................... H01L 29/1004 257/499 |
| 2014/0019132 A1 | 1/2014 | Kuwabara |
| 2014/0054788 A1 | 2/2014 | Majima et al. |
| 2014/0191322 A1 | 7/2014 | Botula et al. |
| 2014/0292415 A1 | 10/2014 | Kovacic |
| 2015/0170990 A1 | 6/2015 | Tseng et al. |
| 2017/0365604 A1 | 12/2017 | Suh et al. |

OTHER PUBLICATIONS

Notice of Allowance dated Sep. 30, 2019 in related U.S. Appl. No. 16/009,561, 9 Pages.
Notice of Allowance dated Nov. 1, 2019 in related U.S. Appl. No. 16/009,561, 9 Pages.
Notice of Allowance dated Nov. 4, 2019 in related U.S. Appl. No. 16/031,210, 8 Pages.
Notice of Allowance dated Mar. 26, 2021 in related U.S. Appl. No. 16/534,052, 10 pages.
Office Action dated Jul. 20, 2020 in related U.S. Appl. No. 16/534,052, 20 pages.
Final Office Action dated Dec. 22, 2020 in related U.S. Appl. No. 16/534,052, 25 pages.

* cited by examiner

INTEGRATED CIRCUIT HEAT DISSIPATION USING NANOSTRUCTURES

FIELD OF THE INVENTION

The present invention relates to integrated circuits and, more particularly, to methods and systems for dissipating heat in integrated circuit devices.

BACKGROUND

Silicon-on-insulator is the process of fabricating silicon based devices, such as complementary metal oxide semiconductor (CMOS) field effect transistors (FET) on top of a layer of electrically insulating material, such as an oxide. The layer of oxide is on top of a bulk silicon substrate in an integrated circuit (IC) chip and acts as an electrical barrier between the devices (e.g., FETs) and the bulk silicon. The layer of oxide greatly reduces electrical leakage from the devices, but also greatly reduces heat flow away from these devices. Accumulation of heat within a device, such as a FET, can reduce the performance and/or useful lifetime of the device.

Heat generation is a limiting factor to improving device operation in many technologies. For example, in radio frequency (RF) CMOS, switch performance is severely limited by the heat generated by the switch at high frequency. RF switches can use 200-300 mW of power, while an RF amplifier can use up to 3 W of power. This large amount of current flow over a relatively small region can result in heating of the devices up to 200° C. in the case of an RF amplifier. These elevated temperatures can significantly change the characteristics of the devices, as well as degrade the integrity of its construction materials. Since many of these devices are now built on SOI, the primary path for drawing heat away from the devices is through the electrical contacts formed over the devices. Further amplifying this problem is the desire to remove or reduce the number of electrical contacts in order to lower the capacitance of the devices, which will increase the need to dissipate heat because the electrical contacts do provide a path for the heat to escape. The RF parts affected by this issue are largely in cellular telephones.

Similar heat-related issues are present in the bipolar junction transistor (BJT) devices that are commonly used in radar and collision avoidance. SiGe-based BJT devices are driving toward increased operating frequencies of up to 300 GHz. As this frequency increases, the trapped residual heat plays a more prevalent role in degrading device performance. Passive structures, such as resistors, are also negatively affected by excess heat, which can affect the temperature coefficient of resistance.

SUMMARY

In a first aspect of the invention, a method of manufacturing a semiconductor structure includes forming an isolation layer on an electrically conductive feature of an integrated circuit device, wherein the isolation layer is electrically insulating and thermally conducting. The method also includes forming an electrically conductive layer on the isolation layer. The method additionally includes forming a plurality of nanowire structures on a surface of the electrically conductive layer.

In another aspect of the invention, a method of manufacturing a semiconductor structure includes forming an isolation layer on an electrically conductive feature of an integrated circuit device. The method includes forming an electrically conductive layer on the isolation layer. The method also includes forming a plurality of nanowire structures on a surface of the electrically conductive layer. The isolation layer is formed to electrically isolate the electrically conductive feature from the electrically conductive layer. The plurality of nanowire structures are formed of a high thermal conductivity material that provides a heat path away from the electrically conductive feature.

In yet another aspect of the invention, a semiconductor structure includes: an isolation layer on an electrically conductive feature of an integrated circuit device; an electrically conductive layer on the isolation layer; and a plurality of nanowire structures on a surface of the electrically conductive layer. The isolation layer electrically isolates the electrically conductive feature from the electrically conductive layer. The plurality of nanowire structures are composed of a high thermal conductivity material that provides a heat path away from the electrically conductive feature.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a semiconductor structure with nanowires which comprises the structures of the present invention. In still further embodiments, a method in a computer-aided design system is provided for generating a functional design model of the semiconductor structure with nanowires. The method comprises generating a functional representation of the structural elements of the semiconductor structure with nanowires.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to methods and systems for dissipating heat in integrated circuit devices. According to aspects of the invention, nanowire structures are formed to produce an electrically isolated but thermally conductive path for heat to diffuse away from a device. By placing nanowires on and near devices, the nanowires provide a path for heat dissipation and/or heat transport from a source to a sink, and drastically cool the device, which improves device performance. In embodiments, the nanowires comprise zinc oxide (ZnO), which provides the benefit that the nanowires are easily formed with high selectivity via an electrochemical hydrothermal bath. In addition, ZnO has a high thermal conductivity and is a cost-effective, environmentally friendly, and readily available material. Including these nanowire heat fins in devices as described herein provides for further optimization of devices, such as reducing the number of contacts to lower the capacitance of RF devices.

Implementations of the invention include providing an electrically isolated but thermally conductive path for heat to diffuse away from the device. Such heat removal allows the device to operate with increased performance and reduces the likelihood of heat-related materials degradation. Embodiments include growing ZnO nanowires on top of a conductive material (e.g., silicide) that is deposited on top of an electrical isolation layer above the device. The pads and wiring used in the nanowire deposition may also be used for heat conduction from the nanowire arrays to the metal pads.

The semiconductor structures of the present invention can be manufactured in a number of ways using a number of different tools. In general, and unless otherwise noted herein, the methodologies and tools are used to form structures with dimensions in the micrometer scale. The methodologies, i.e., technologies, employed to manufacture the semiconductor structures of the present invention have been adopted from integrated circuit (IC) technology. For example, the structures of the present invention are built on wafers and are realized in films of material patterned by photolithographic processes on the top of a wafer. In particular, the fabrication of the semiconductor structures of the present invention may use three basic building blocks: (i) deposition of thin films of material on a substrate, (ii) applying a patterned mask on top of the films by photolithographic imaging, and (iii) etching the films selectively to the mask.

Figure 1:
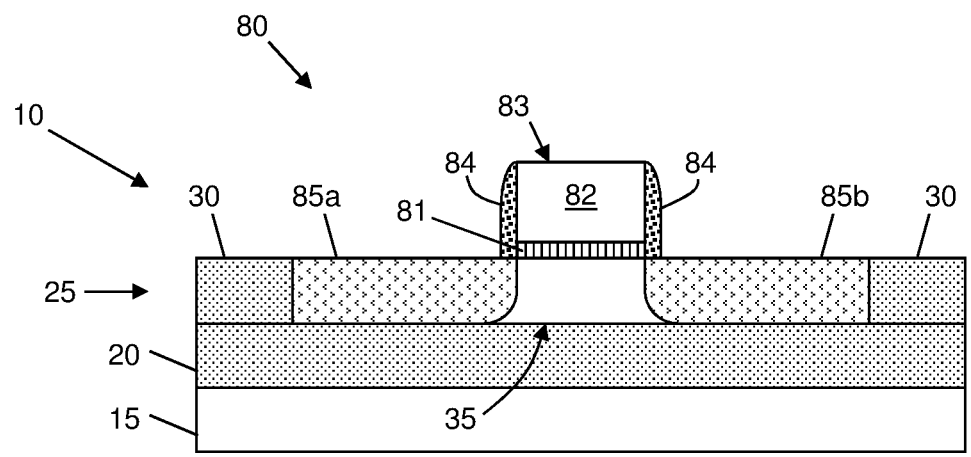
FIGS. 1-13 show processing steps and structures in accordance with aspects of the invention.

FIGS. 1-13 show processing steps and respective structures in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a bulk silicon substrate, a buried insulator layer 20 formed on the substrate 15, and a semiconductor layer 25, which is typically a silicon layer formed on the buried insulator layer 20. The SOI wafer 10 may be fabricated using techniques understood by those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. The buried insulator layer 20 may be composed of oxide, such as $SiO_2$, and may be referred to as a buried oxide (BOX) layer 20. Moreover, although the SOI wafer is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

In embodiments, the SOI wafer 10 has a thickness of about 700 m, with the BOX layer 20 having a thickness in a range of about 0.1 m to about 2 m, and the semiconductor layer 25 having a thickness in a range of about 0.1 μm to about 0.2 μm. However, the invention is not limited to these dimensions, and the various portions of the SOI wafer may have any desired thicknesses based upon the intended use of the final semiconductor device.

Still referring to FIG. 1, shallow trench isolation (STI) structures 30 may be formed in the wafer 10. The STI 30 may be conventional shallow trench isolation structures formed using conventional semiconductor fabrication processes such as photolithographic masking and etching. For example, the STIs 30 may be formed by arranging a photoresist material on the semiconductor layer 25, exposing and developing the photoresist, etching an STI trench in the semiconductor layer 25 through the patterned photoresist (e.g., using a reactive ion etch (RIE) process), stripping the photoresist, filling the trench with an STI material (e.g., $SiO_2$), and planarizing the top surface of the structure (e.g., via chemical mechanical polish (CMP)). The STI 30 locally replaces a portion of the semiconductor layer 25. The remaining portion of the semiconductor layer 25 that is surrounded by the STI 30 is referred to as an island 35.

With continued reference to FIG. 1, a FET 80 is formed in the wafer 10 using conventional semiconductor materials and manufacturing processes. The FET 80 may be of any desired configuration, and may be formed using conventional CMOS fabrication techniques and materials. For example, the FET 80 may be formed by first forming a gate dielectric 81 on the upper surface of the wafer 10 including the top surface of the island 35, forming a gate conductor 82 on the gate dielectric 81, and patterning the gate conductor 82 and the gate dielectric 81 to form a gate 83 on the island 35. The gate dielectric 81 may be any suitable material, including, for example, high-k dielectrics such as hafnium-based materials. The gate conductor 82 can be any suitable material, such as doped polysilicon, metal, or a combination of layers thereof. Sidewall spacers 84 may be formed on the gate conductor 82, e.g., using CVD of nitride or oxide and RIE. Source/drain regions 85a/85b may be formed in the island 35 by performing an ion implantation of appropriate type impurities.

Figure 2:
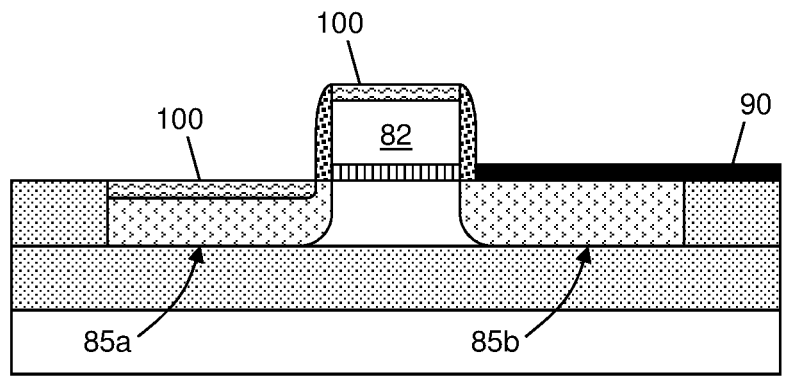

As shown in FIG. 2, a block 90 is formed on the drain region 85b. The block 90 may be composed of any suitable material that prevents the formation of silicide on the drain region 85b in subsequent processing steps. For example, the block 90 may comprise nitride. The block 90 may be formed using conventional CMOS processing techniques, such as depositing a blanket layer of nitride on the entire wafer, and masking and etching the nitride to shape the block 90.

Still referring to FIG. 2, after forming the block 90, silicide 100 is formed on silicon-containing surfaces that are unmasked by the block 90, e.g., on the source region 85a and the gate conductor 82 of the FET 80. The silicide 100 may be formed using conventional CMOS processing techniques, such as: sputtering a layer of metal onto the top surface of the wafer; annealing the wafer to react the metal with silicon in places where the metal contacts silicon; and stripping any unreacted metal.

Figure 3:
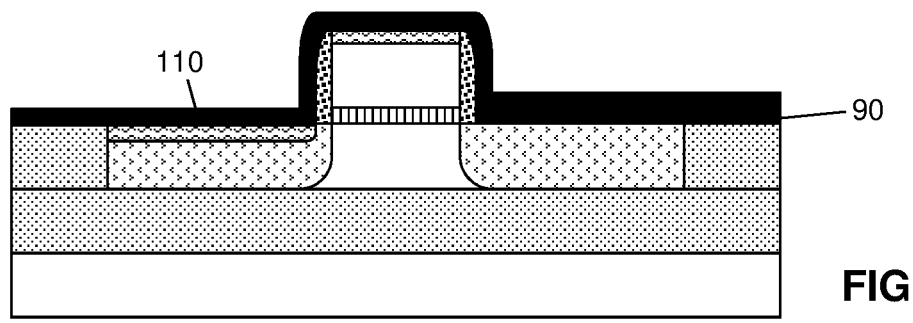

FIG. 3 shows forming a barrier layer 110 on the structure, including on block 90. The barrier layer 110 may be formed using conventional materials and processes, such as CVD of nitride. In embodiments, the barrier layer 110 comprises the same material as the block 90.

Figure 4:
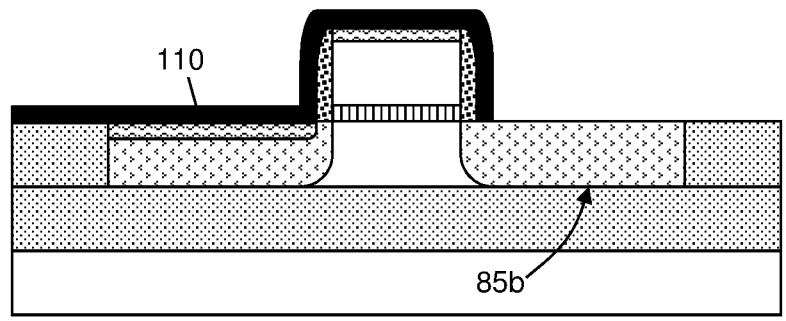

FIG. 4 shows removing portions of the barrier layer 110 and the block 90 to expose the upper surface of the drain region 85b. The portions of the barrier layer 110 and block 90 may be removed using standard patterning, such as photolithographic masking and etching (e.g., RIE).

Figure 5:
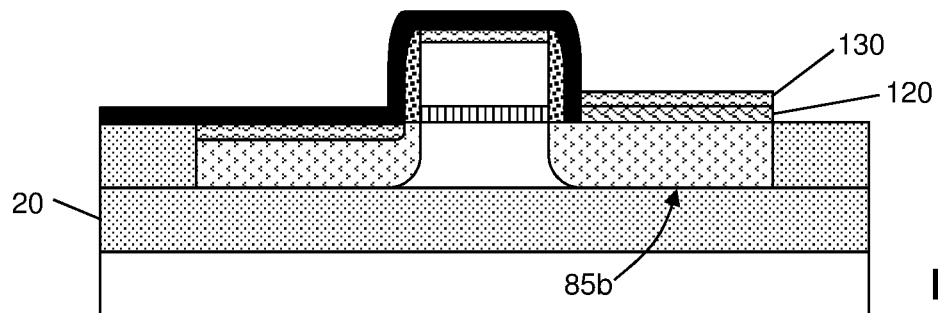

FIG. 5 shows forming an isolation layer 120 on the drain region 85b, and forming an electrical conducting layer 130 on the isolation layer 120 in accordance with aspects of the invention. In embodiments, the isolation layer 120 is composed of a material that has a low electrical conductivity (e.g., is a dielectric material) and a high thermal conductivity. As used herein, a high thermal conductivity material is a material that has a thermal conductivity that is substantially greater than (e.g., at least ten times) the thermal conductivity of the material of the BOX layer 20. In embodiments, the BOX layer 20 is composed of $SiO_2$ that has a nominal thermal conductivity of about 1 W/(m·K), and the isolation layer 120 is composed of $Al_2O_3$ (referred to as alumina or aluminum oxide), which has a nominal thermal conductivity of about 30 W/(m·K). The isolation layer 120 is not limited to these materials, and any suitable low electrical conductivity and high thermal conductivity material may be used. The isolation layer 120 may be formed using standard processing techniques, such as CVD or plasma enhanced CVD (PECVD) and photolithographic patterning. The isolation layer 120 is not limited to alumina, and other materials may be used, including a polymorphic ceramic such as boron nitride (BN), etc. The isolation layer may also comprise other ceramic materials, such as zirconia ($ZrO_2$) and aluminum nitride (AlN).

With continued reference to FIG. 5, the conducting layer 130 is formed on the isolation layer 120. The conducting layer 130 may be composed of, for example, silicide, sputtered metal, or the like. When composed of silicide, the conducting layer 130 may be formed in the manner described herein, e.g., depositing polysilicon, patterning the polysilicon, sputtering metal, reacting the metal with the polysilicon, and removing unreacted metal. In aspects, the conducting layer 130 constitutes an electrically conductive layer formed on the isolation layer 120 that, in turn, is formed on an electrically conductive feature of the integrated circuit device, i.e., the drain region 85b. The invention is not limited to use with a drain region, however. Instead, as described herein, the electrically conductive feature is a semiconductor device, such a field effect transistor or bipolar junction transistor or a diffusion resistor, which can generate heat during operation to the extent that the generated heat degrades the performance of the device itself, or of neighboring devices, or physically damages the constituent elements of the structure in which the devices are fabricated.

Figure 6:
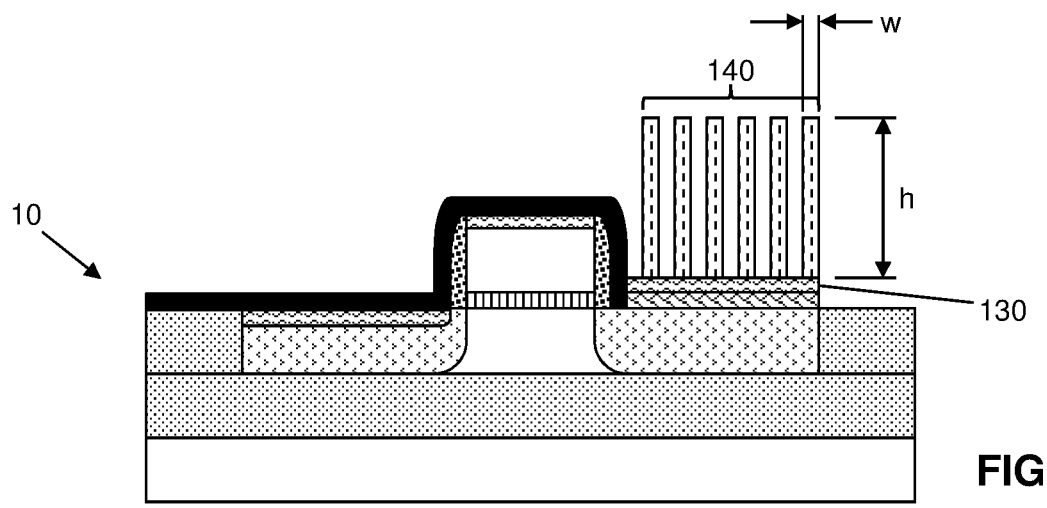

FIG. 6 shows forming high thermal conductivity nanowires 140 on the conducting layer 130 in accordance with aspects of the invention. The nanowires 140 are vertically oriented columnar structures that extend upward from the surface of the conducting layer 130. The nanowires 140 are composed of high thermal conductivity material and function as heat exchanger fins that enhance the rate of heat transfer away from the FET 80. In this manner, the nanowires 140 provide a heat path to dissipate heat and/or transport heat away from the electrically conductive feature on which they are formed.

In embodiments, the nanowires 140 comprise zinc oxide (ZnO) and are formed with high selectivity using an electrochemical hydrothermal bath. ZnO is a semiconductor material having a high thermal conductivity of about 135 W/(m·K). An exemplary process for forming the nanowires 140 includes providing a solution comprising a 1:1 mixture of 0.025 M zinc nitrate hexahydrate ($Zn(NO_3)_2 \cdot 6H2O$) and 0.025 M hexamethylenetetramine (HMTA, $C_6H_2N_4$) in deionized water. The solution is stirred and heated to about 90° C. The wafer is suspended in the solution at this temperature with the growth surface (i.e., the exposed conducting layer 130) facing downward. A first electrode of an external voltage application circuit is connected through wiring in the wafer 10 to the conducting layer 130, and a second electrode of the external voltage application circuit is suspended in the solution. The external voltage application circuit applies a potential of about 1 V to 5 V between the first electrode and the second electrode while the growth surface is submerged in the solution. Under these conditions, the nanowires 140 grow as spaced apart columnar structures on the growth surface via an electrochemical deposition process. The invention is not limited to forming the nanowires 140 using an electrochemical deposition process, and instead the nanowires 140 may be formed using any suitable formation process.

The voltage and amount of time applying the voltage in solution may be used to control the height and width of the nanowires 140. In one example, each one of the nanowires 140 is grown to a nominal height "h" of about 1700 nm and a nominal width "w" of about 240 nm using a voltage of 2.5 V and a growth time of 60 minutes. In one example, each one of the nanowires 140 is grown to a nominal height of about 3000 nm and a nominal width of about 640 nm using a voltage of 2.5 V and a growth time of 120 minutes. Height of the nanowires 140 is measured as the extent of growth outward from the growth surface, e.g., the exposed surface of the conducting layer 130. As used herein, nanowire and nanowire structure refer to a columnar structure having a sub-micron width. The invention is not limited to these values, and one or more of the parameters of the growth process (e.g., constituents of the solution, temperature, voltage potential, growth time, etc.) may be tailored to achieve a desired nanowire structure according to aspects of the invention.

Figure 7:
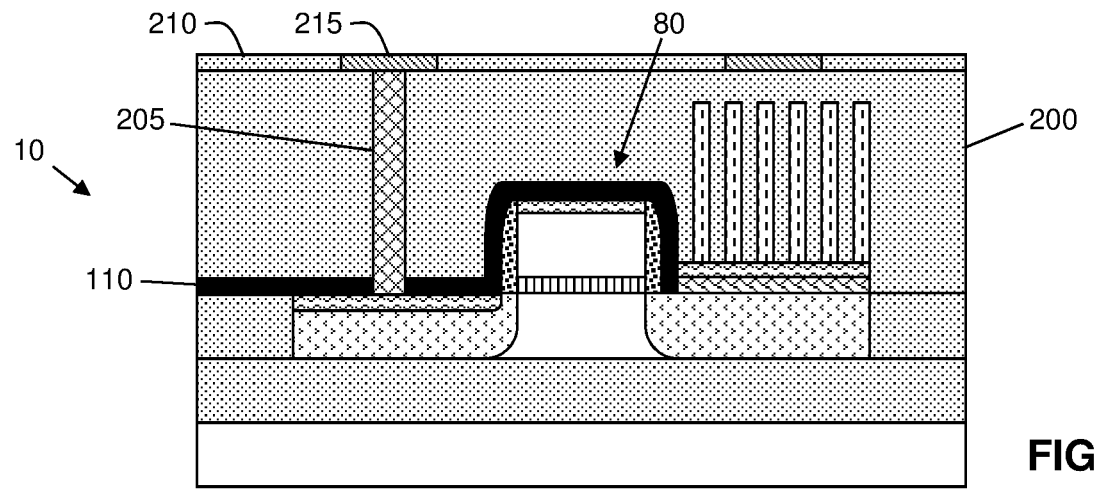

FIG. 7 shows the structure after forming an insulator layer 200 on the wafer 10 and electrical contacts 205 in the insulator layer 200. The insulator layer 200 and electrical contacts 205 may be formed using conventional CMOS processes and materials. For example, the insulator layer 200 may comprise any conventional dielectric material, such as, for example, silicon dioxide ($SiO_2$), borophosphosilicate glass (BPSG), etc. The electrical contacts 205 may be formed by forming a photomask on the insulator layer 200, etching holes in the insulator layer 200 and barrier layer 110 through the photomask, stripping the photomask, filling the holes with an electrically conductive material (e.g., tungsten, copper, etc.) using CVD, and planarizing the top surface of the wafer 10 using CMP. One or more additional insulator layers 210 and metal layers 215 may be formed on the insulator layer 200 and electrical contacts 205 to provide electrical connectivity to the source and drain regions of the FET 80.

Figure 8:
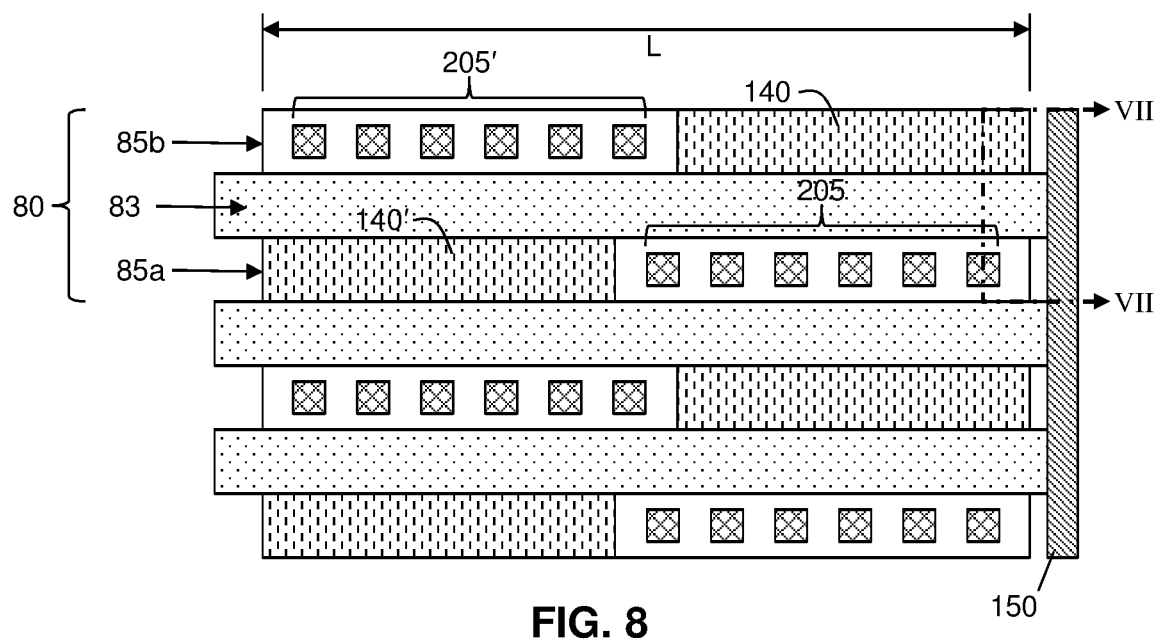

FIG. 8 shows a plan view of an RF device including a FET 80 formed in accordance with the process described with respect to FIGS. 1-7. FIG. 7 is a cross section view taken along line VII-VII of FIG. 8. As shown in FIG. 8, the source region 85a and drain region 85b extend for length "L" on opposite sides of gate 83. Gate contact 150 may be placed in contact with each gate 83. In embodiments, the nanowires 140 (collectively shown as a shaded area) are formed on a first portion of the drain region 85b, and contacts 205' are formed on a second portion of the drain region 85b. Similarly, contacts 205 are formed on a first portion of the source region 85a, and nanowires 140' (collectively shown as a shaded area) are formed on a second portion of the source region 85a. In this manner each one of the source region 85a and drain region 85b is provided with its own electrical contacts and its own nanowire structures.

In aspects, the nanowires 140' on the source region 85a and the nanowires 140 on the drain region 85b are formed simultaneously. For example, a conducting layer similar to conducting layer 130 may be formed on the second portion of source region 85a at the same time and in the same manner of formation as conducting layer 130 using appropriate mask patterns. In this manner, nanowires 140 and 140' are grown at the same time using the electrochemical deposition process described herein. Similarly, the contacts 205 and 205' may be formed simultaneously using the processes described with respect to FIG. 7 and appropriate mask patterns.

Figure 9:
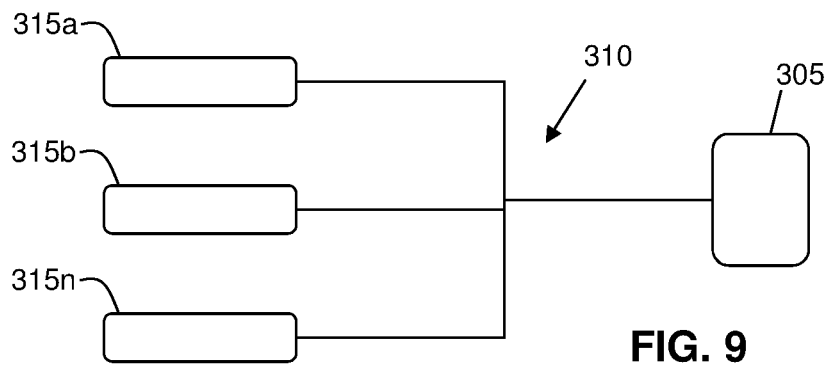
Figure 10:
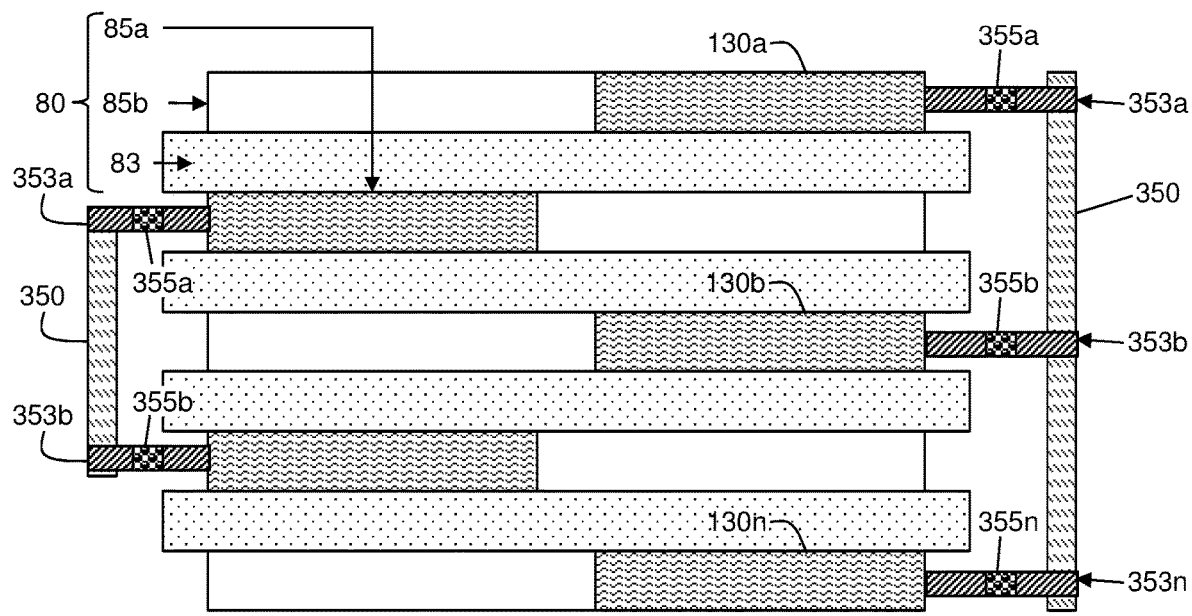
Figure 11:
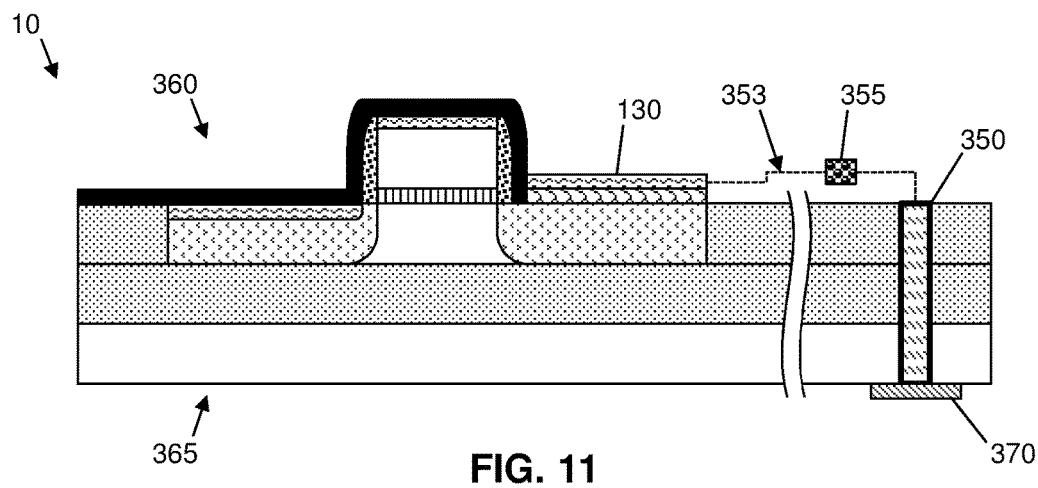

FIGS. 9-11 depict exemplary arrangements for providing an electrically conductive path to the growth surface of a wafer for applying the voltage when growing the nanowires in accordance with aspects of the invention. FIG. 9 shows a schematic diagram that includes a contact pad 305 formed on the wafer (e.g., wafer 10), the contact pad 305 being structured and arranged to physically contact the first electrode of the external voltage application circuit used in the nanowire electrochemical deposition process. As shown in FIG. 9, electrically conductive wiring 310 (e.g., wires, vias, interconnects, etc.) is formed in the structure of the wafer between the contact pad 305 and plural growth surfaces 315a-n (e.g., plural discrete instances of conducting layers 130). In this manner, the voltage potential may be applied to the growth surfaces to facilitate growing the nanowire structures. In embodiments, the growth surfaces are placed where the heat conduction and/or dissipation is desired, e.g., as described with respect to FIG. 8.

FIG. 10 shows a plan view of a wafer in which growth surfaces are connected to a substrate contact in accordance with aspects of the invention. The structure of FIG. 10 includes a plurality of FETs 80 including a plurality of gates 83 and a plurality of source/drain regions 85a/85b, e.g., in an RF device layout similar to that shown in FIG. 8 before the contacts and nanowires are formed. In embodiments, each one of a plurality of growth surfaces, i.e., conducting layers 130a-n, is electrically connected to a substrate contact 350 by a wiring paths 353a-n. Each wiring path 353a-n may include a breakable element 355a-n, such as a high resistance link or e-fuse. The substrate contact 350 is connected to a contact pad, such as contact pad 305 described in FIG. 9, for providing the voltage potential across the conducting layers 130a-n for growing the nanowire structures thereon. After forming the nanowire structures on the conducting layers 130a-n, the breakable elements 355a-n may be physically broken to create an electrical discontinuity between the conducting layers 130a-n and the substrate contact 350. For example, when the breakable elements 355a-n comprise e-fuses, the breakable elements 355a-n may be broken by applying a sufficiently high voltage to blow the e-fuse (e.g., a programming voltage).

FIG. 11 shows an embodiment of the structure of FIG. 5 connected to a contact pad in a manner similar to that described with respect to FIG. 10. As depicted in FIG. 11, the conducting layer 130 is electrically connected to a substrate contact 350 via wiring path 353 (shown in dashed lines) and breakable element 355. In aspects, the substrate contact 350 is an electrically conductive through silicon via that extends from a front side 360 of the wafer 10 to a back side 365 of the wafer 10, and contacting a contact pad 370 (e.g., similar to contact pad 305) formed on the back side 365. In this manner, contact pad 370 on the back side 365 of the wafer 10 may be used as a physical contact location for connecting an electrode that provides the voltage to conducting layer 130 during the nanowire growth process.

Figure 12:
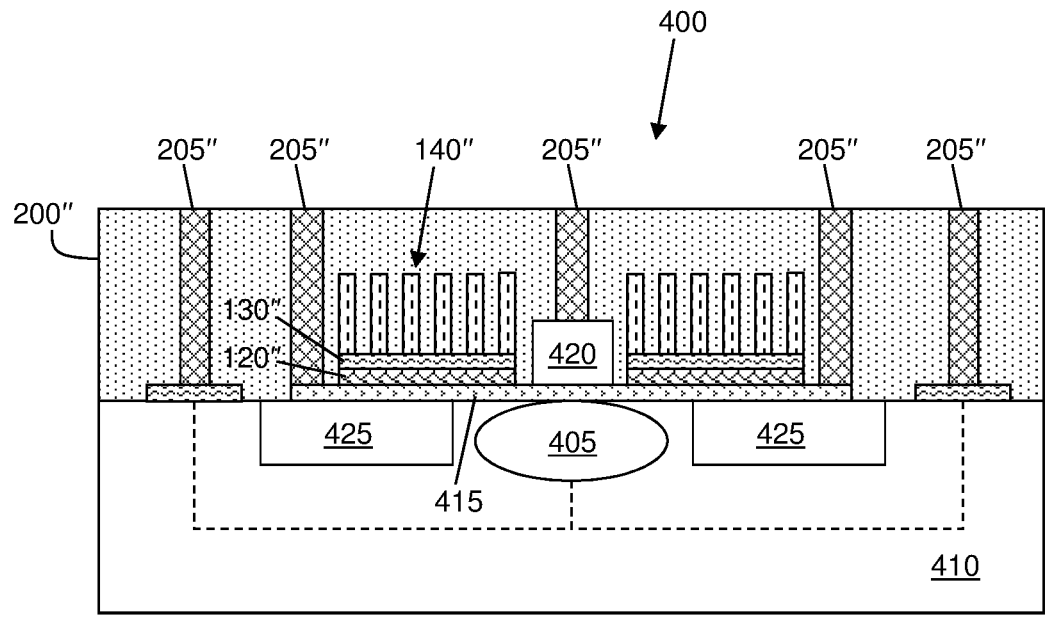

FIG. 12 depicts an implementation of nanowire structures on a bipolar junction transistor (BJT) in accordance with aspects of the invention. As shown in FIG. 12, a BJT 400 may comprise an n-type semiconductor material collector 405 formed in a substrate 410, a p-type semiconductor material base 415 formed over the collector 405, and an n-type semiconductor material emitter 420 formed over the base 415. The substrate 410 may comprise doped silicon and the base 415 may comprise SiGe, for example. STI structures 425 may be formed in the substrate 410 around the collector 405. In embodiments, an isolation layer 120" and a conducting layer 130" are formed on portions of the base 415, e.g., in a manner similar to that described with respect to FIG. 5. Subsequently, nanowire structures 140" are formed on the conducting layer 130", e.g., in a manner similar to that described with respect to FIG. 6. An insulator layer 200" and electrical contacts 205" may be formed over the BJT 400, e.g., in a manner similar to that described with respect to FIG. 7. Depending upon the desired configuration of the BJT as the functional circuit of interest, the nanowires can be grown on one of the collector contacts for maximum heat dissipation. This would be useful in a "common base" BJT configuration, example.

Figure 13:
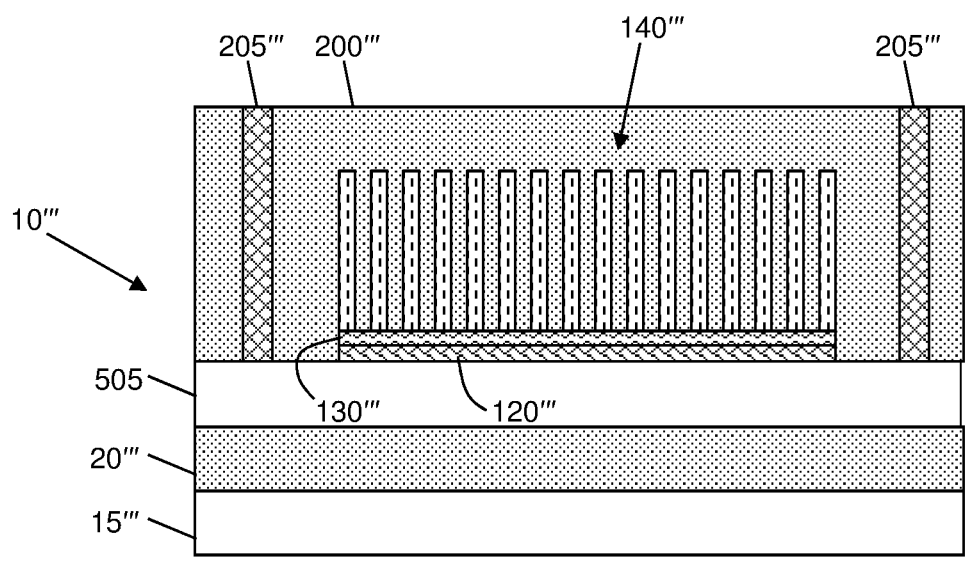

FIG. 13 depicts an implementation of nanowire structures on a passive device in accordance with aspects of the invention. As shown in FIG. 13, passive device may comprise a resistor 505 formed on a BOX layer 20''' on a substrate 15'''. In embodiments, an isolation layer 120''' and a conducting layer 130''' are formed on portions of the resistor 505, e.g., in a manner similar to that described with respect to FIG. 5. Subsequently, nanowire structures 140''' are formed on the conducting layer 130''', e.g., in a manner similar to that described with respect to FIG. 6. An insulator layer 200''' and electrical contacts 205''' may be formed over the resistor 505, e.g., in a manner similar to that described with respect to FIG. 7.

Figure 14:
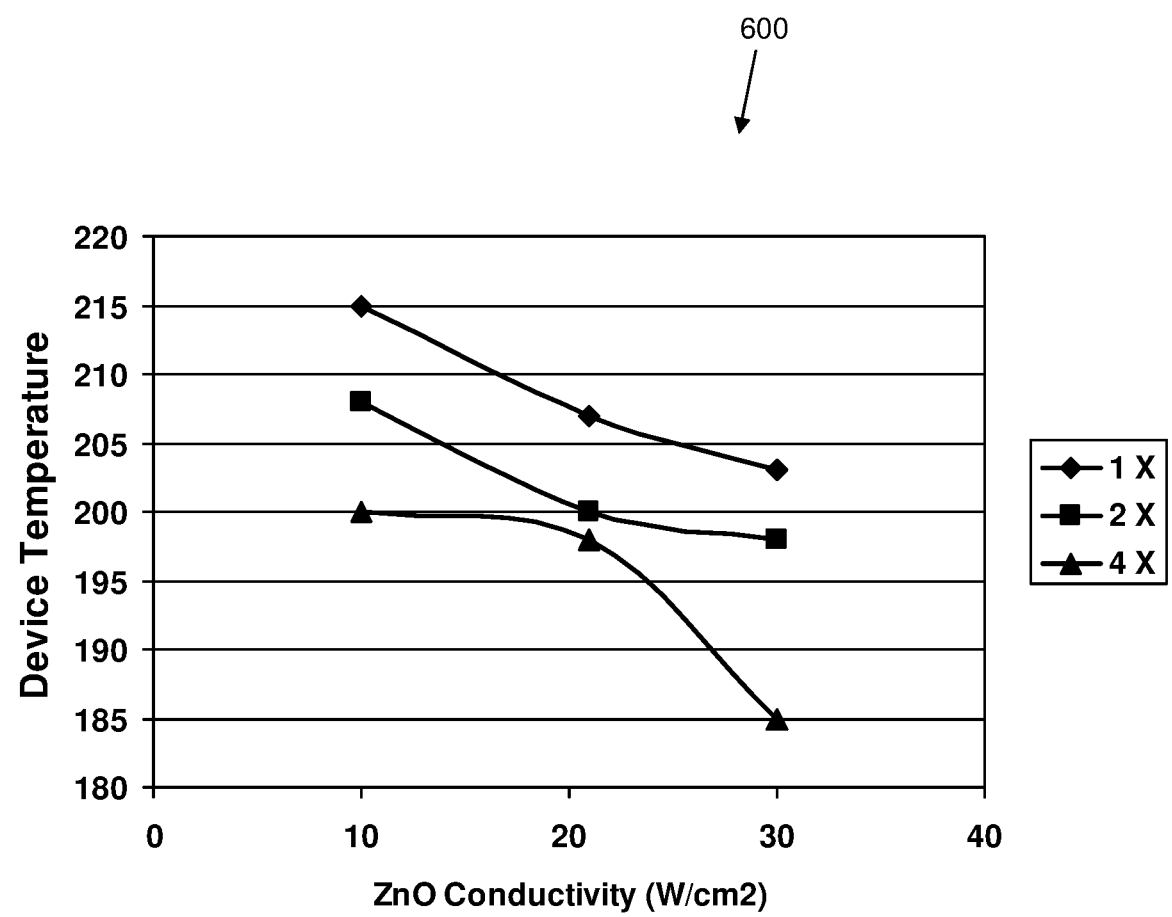
FIG. 14 shows data of a thermal model in accordance with aspects of the invention.

FIG. 14 shows a plot 600 of data illustrating device temperature (° C.) versus ZnO stud density and conductivity (W/cm$^2$) for three different stud densities (1×, 2×, 4×) in accordance with aspects of the invention. Stud density relates to nanowire structures 130, where a 1×stud density corresponds to 250 nm×250 nm. The data was obtained using a thermal model of an SOI device similar to that described with respect to FIGS. 1-7. The thermal modeling shows device temperature improvement on the order of 50-60 degrees using implementations of the invention.

Figure 15:
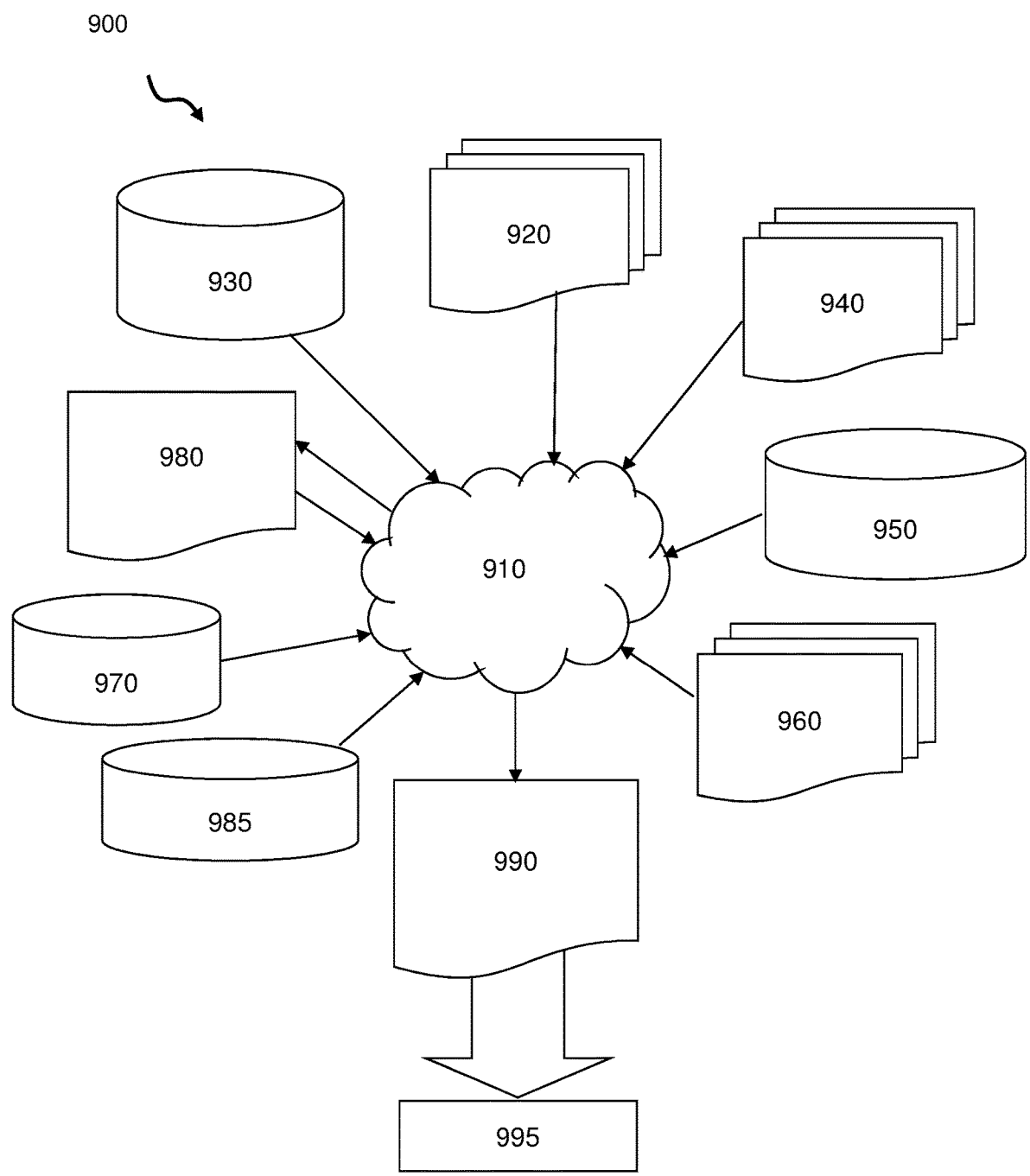
FIG. 15 is a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-13. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-13. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-13 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-13. In one embodiment, design structure 990 may comprise a compiled, executable HDL simulation model that functionally simulates the devices shown in FIGS. 1-13.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-13. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A transistor, comprising:
   a collector region;
   a base region;
   an emitter region, each of the collector region, the base region and the emitter region located over a substrate;
   a plurality of nanowire structures above a first portion of the base region;
   an isolation layer interposed between the nanowire structures and the first portion of the base region, wherein the isolation layer comprises a high thermal conductivity material that electrically isolates the base region from an electrically conductive layer; and
   a collector electrical contact over a portion of the substrate adjacent to a portion of the base region, wherein the portion of the base region is located between the first portion of the base region in which the nanowire structures are formed on and the portion of the substrate which the collector electrical contact is formed over.

2. The transistor of claim 1, wherein the isolation layer comprises polymorphic ceramic.

3. The transistor of claim 1, wherein the isolation layer comprises one of alumina ($Al_2O_3$), boron nitride (BN), zirconia ($ZrO_2$), and aluminum nitride (AlN).

4. The transistor of claim 1, wherein the plurality of nanowire structures comprises a plurality of spaced apart columnar structures each having a sub-micron width.

5. The transistor of claim 1, further comprising:
   an insulator layer on and around the plurality of nanowire structures; and
   an electrical contact in the insulator layer.

6. The bipolar junction transistor of claim 1, wherein:
   the collector region comprises n-type semiconductor material; and
   the base region comprises p-type semiconductor material.

7. The transistor of claim 6, wherein the substrate comprises doped silicon.

8. The transistor of claim 1, further comprising shallow trench isolation structures formed in the substrate around the collector region.

9. The transistor of claim 1, wherein the collector electrical contact is over a silicide layer which is located between the collector electrical contact and the portion of the substrate which the collector electrical contact is formed over.

10. The transistor of claim 9, further comprising an insulator layer formed over the nanowire structures, the electrically conductive layer and the collector electrical contact.

11. The transistor of claim 10, wherein the collector electrical contact extends through the insulator layer from an upper surface of the insulator layer to an upper surface of the silicide layer.

12. The transistor of claim 11, wherein the silicide layer is adjacent to and spaced apart from the base region.

13. The transistor of claim 12, further comprising a base contact formed on a second portion of the base region.

14. The transistor of claim 13, wherein the insulator layer is formed over the second portion of the base region.

15. The transistor of claim 14, further comprising a base contact formed on the second portion of the base region, wherein the base contact extends through the insulator layer from an upper surface of the insulator layer to an upper surface of the base region.

16. The transistor of claim 1, wherein the substrate comprises doped silicon and the base region comprises SiGe.

17. The transistor of claim 16, further comprising shallow trench isolation structures formed in the substrate around the collector region.

18. The transistor of claim 1, further comprising an emitter formed over the base region.

19. The transistor of claim 1, wherein the electrically conductive layer is directly on the isolation layer, the isolation layer is directly on the base region, and the base region is directly on shallow trench isolation structures.

20. The transistor of claim 19, wherein the nanowire structures is directly on the electrically conductive layer, and the electrically conducive layer is part of a drain region.

* * * * *